United States Patent [19]

Nakamura et al.

[11] Patent Number: 5,019,485
[45] Date of Patent: May 28, 1991

[54] PROCESS OF USING AN ELECTRICALLY CONDUCTIVE LAYER-PROVIDING COMPOSITION FOR FORMATION OF RESIST PATTERNS

[75] Inventors: Yuko Nakamura, Kawasaki; Satoshi Takechi, Machida, both of Japan

[73] Assignee: Fujitsu Limited, Kawasaki, Japan

[21] Appl. No.: 420,427

[22] Filed: Oct. 12, 1989

[30] Foreign Application Priority Data

Oct. 13, 1988 [JP] Japan ................... 63-256022

[51] Int. Cl.$^5$ ............................................. G03C 5/00
[52] U.S. Cl. .......................... 430/296; 430/270; 430/271; 430/273; 430/311; 430/325
[58] Field of Search ............ 430/270, 296, 311, 325, 430/394, 271, 273

[56] References Cited

U.S. PATENT DOCUMENTS

| 4,935,094 | 6/1990 | Mixon et al. | 430/296 |
| 4,939,052 | 7/1990 | Nakagawa | 430/296 |
| 4,939,070 | 7/1990 | Brunsvold et al. | 430/296 |

FOREIGN PATENT DOCUMENTS

| 54-43681 | 4/1979 | Japan. |
| 54-116883 | 9/1979 | Japan. |
| 56-114323 | 9/1981 | Japan. |
| 56-125833 | 10/1981 | Japan. |
| 56-125834 | 10/1981 | Japan. |
| 58-54633 | 3/1983 | Japan. |
| 58-136029 | 8/1983 | Japan. |
| 59-93441 | 5/1984 | Japan. |
| 59-104126 | 6/1984 | Japan. |
| 59-132124 | 7/1984 | Japan. |
| 63-181428 | 7/1988 | Japan. |
| 63-204724 | 8/1988 | Japan. |
| 63-254728 | 10/1988 | Japan. |
| 63-254729 | 10/1988 | Japan. |

Primary Examiner—Jack P. Brammer
Attorney, Agent, or Firm—Armstrong, Nikaido, Marmelstein, Kubovcik, & Murray

[57] ABSTRACT

Electrically conductive layer-providing compositions comprising a conducting or semiconducting polymer and/or a non-conducting precursor thereof and a photo-acid generator having a sensitivity to an ultraviolet radiation having a wavelength of 300 nm or less. The electrically conductive layer, when an electron beam resist layer adjacent thereto is exposed to a pattern of the electron beam, can effectively prevent an accumulation of an electrical charge on the resist layer and accordingly a misalignment of the resist pattern. In addition, the compositions and electrically conductive layer resulting therefrom can be stably stored if not exposed to ultraviolet radiation. Pattern formation processes using the electrically conductive layer-providing compositions are also provided.

14 Claims, 4 Drawing Sheets

PROCESS OF USING AN ELECTRICALLY CONDUCTIVE LAYER-PROVIDING COMPOSITION FOR FORMATION OF RESIST PATTERNS

BACKGROUND OF THE INVENTION

1. Field of the Invention

The present invention relates to an electron beam lithographic process, more particularly, to an electrically conductive layer-providing composition suitable for forming an electron beam resist pattern in an electron beam lithographic process, and a process for the formation of resist patterns using the electrically conductive layer-providing composition. The present invention can be advantageously utilized in the production of semiconductor devices such as large-scale integrated (LSI) circuits, very-large-scale integrated (VLSI) circuits, and bubble memory devices.

2. Description of the Related Art

Currently, in view of the high degree of density and integration required for elements in the production of LSIs, VLSIs and other semiconductor devices, an electron beam (EB) lithographic process in which an electron beam is used as an exposure source, is now widely used in place of other conventional radiation processes such as ultraviolet radiation, X-rays and ion beams, and a plurality of resist materials suitable for this EB lithographic process, such as a silicon-containing resist are used. In this EB lithographic process, a surface of the resist layer is sequentially scanned with an electron beam in accordance with a predetermined pattern of images to be recorded. Unfortunately, during the EB scanning or patterning, a site to be newly scanned is adversely affected by an electrical charge accumulated in the exposed sites adjacent thereto. Namely, since the exposed site has been electrically charged by the EB process, an electrical field created thereby has an affect on the course of the scanning beam directed to an adjacent new site. More particularly, the scanning beam is affected by the electrical field and is distorted, and thus an exposure pattern of the beam recorded as a latent image in the resist layer is misaligned. FIGS. 1A and 1B illustrate this formation of the shifted resist pattern; wherein FIG. 1A is a plane view of the semiconductor device having an EB resist pattern formed on a substrate thereof. In FIG. 1A, a substrate 1 has two circuit elements 3 and 4 having fabricated thereon and a pattern 2 of the EB resist to be used as a mask in the next fabrication step. The hatched area shows an unmasked surface of the substrate surface. The illustrated EB resist pattern will be produced if electrification of the resist layer does not occur during the EB scanning, but as described above, in practice, this electrification of the resist layer is unavoidable, and therefore, as illustrated in FIG. 1B, a misaligned pattern 5 of the resist is produced on the surface of substrate 1. Apparently, the semiconductor device material having a misaligned resist pattern must be discarded to avoid a production of commercially unacceptable devices, and further lowers the yield and increases the production costs. Therefore, there is an urgent need for an improved EB lithographic process not having the above-described problem of a misalignment of the exposure pattern.

Numerous patent publications teach that the above problem can be solved by using an electrically conductive layer or coating, as such a layer or coating will effectively discharge or dissipate any electrical charge accumulated in the resist layer. Further, these publications teach that such an electrically conductive layer can be formed by any conventional film formation methods, including, for example, a vacuum deposition of metals or electrically conductive inorganic materials, or a coating of a polymeric material containing metals, electrically conductive inorganic materials, surface-active agents, charge transfer agents or complexes, or related materials dispersed therein. Typical of the patent publications teaching the above technologies are those shown as follows:

(1) Japanese Unexamined Patent Publication (Kokai) No. 54-43681

This Kokai concerns an EB exposure method, and teaches the use of a carbon thin film through which electrons accumulated on an EB resist film are discharged. After the EB patterning is completed, the carbon layer is removed by methyl isobutyl ketone, which is a developer for the EB resist film.

(2) Japanese Kokai No. 54-116883

This Kokai concerns an EB exposure method, and teaches the vacuum deposition of a conductive film such as aluminum on an EB resist film, to improve the exposure accuracy by avoiding the usual electrostatic accumulation occurring during the EB process. The conductive film is removed by using a 0.1N NaOH solution.

(3) Japanese Kokai No. 56-114323

This Kokai concerns an EB lithographic method, and teaches immersion of a substrate, having an EB resist film deposited thereon, in a solution of metal chloride or complex salt, to thereby impart a conductivity to the resist film, whereby the aforementioned electric charging is prevented.

(4) Japanese Kokai No. 56-125833

This Kokai concerns an EB exposure methods, and teaches the use of an EB resist containing conductive fine powders such as carbon dispersed therein on an insulating material. When the EB is pattern-scanned on the resist film, a very accurate resist pattern can be formed, because the electrification of the resist film and warping of the EB pattern are prevented.

(5) Japanese Kokai No. 56-125834

This Kokai concerns an EB exposure method, and teaches an insertion of a conductive glass film between an EB resist film and an insulating material, to prevent an electrification of the EB resist film during the EB exposure.

(6) Japanese Kokai No. 58-54633

This Kokai concerns a microfabrication method whereby, to reduce fogging caused by a back scattering of the EB, a high-density conductive film such as a vacuum deposited Pt layer is inserted between an EB resist layer and a fabricated underlying layer.

(7) Japanese Kokai No. 58-136029

This Kokai concerns a pattern formation process preventing an electrification under exposure to the EB and teaches the use of an intermediate layer consisting of a chalcogenide glass in a three-layered resist structure (i.e., an organic polymer layer, the intermediate layer and an EB resist layer).

(8) Japanese Kokai No. 59-93441

This Kokai concerns an EB resist material having a low volume resistivity ($10^0$–$10^{10}$ $\Omega$cm) low enough to prevent electrification during the EB exposure, and teaches an addition of halogen-tetracyanoethylene to a charge transfer type compound such as perylene halide.

(9) Japanese Kokai 59-104126

This Kokai concerns a patterning method using a four-layered resist structure (i.e., a resin resist layer, a layer of an inorganic material, a conductive layer and an EB resist layer). The conductive layer is formed by sputtering molybdenum at a thickness of about 0.01 μm on a silicon oxide layer as the inorganic layer. The presence of the conductive layer effectively prevents a misalignment of the EB pattern.

(10) Japanese Kokai No. 59-132124

This Kokai concerns a production process for semiconductor devices whereby, to prevent electrification of an EB resist layer during the EB exposure, a conductive polysilicon layer is inserted between the EB resist layer and an insulating layer.

(11) Japanese Kokai No. 63-181428

This Kokai concerns a process for the formation of resist patterns in a multilayer resist process whereby, to prevent electrification of an EB resist layer, a conductive layer such as a thin film of polyvinyl alcohol doped with minute particles of carbon is inserted between the EB resist layer and a silicon substrate.

(12) Japanese Kokai No. 63-204724

This Kokai concerns a process for the formation of resist patterns in a multilayer resist process whereby, to prevent a lower resist layer from electrification without using an Si thin film, a polymeric thin film comprising a salt of an anion radical of polystyrene sulfonic acid and a positively charged radical such as a layer of ammonium polystyrene sulfonate, is coated on a silicon substrate.

(13) Japanese Kokai No. 63-254728

This Kokai concerns a process for the formation of EB resist patterns whereby, to obtain a resist pattern having an accurate pattern, an ammonium polystyrene sulfonate film as an EB resist layer is formed on a semi-insulating GaAs substrate.

(14) Japanese Kokai No. 63-254729

This Kokai concerns a process for the formation of EB resist patterns whereby, to obtain a resist pattern without distortion, a thin conductive film of ammonium polystyrene sulfonate and an EB resist film of polymethylmethacrylate are formed on a semi-insulating GaAs substrate.

Note, among these Japanese Kokais, Japanese Kokai Nos. 63-254728 and 63-254729 were published in Japan after the filing data (Oct. 13, 1988) of the basic Japanese application of the present application, and are cited herein only for reference.

Nevertheless, problems arise in the formation of the conductive layer suggested in each of these Japanese Kokais, since a vacuum deposition or sputtering method requires a specific device and thus, it is preferable to avoid the use of such a method and to further simplify the formation process. Further, when the polymeric material having a conductive material such as metal or conductive inorganic materials dispersed therein is used in the formation of the conductive layer, the resultant layer suffers from an insufficient layer formation and poor properties of the layer. For example, small particles of the dispersed conductive material can remain on a surface of the resist layer and hinder the formation of an accurate and fine resist pattern. Furthermore, when the surface-active agents or charge transfer agents are used as the conductive material, a remarkable reduction of the antistatic function thereof occurs, because the antistatic function is notably reduced by various factors such as aging or environmental conditions, for example, temperature and humidity. Obviously, the prior art conductive layers for use in the EB lithographic process face serious problems in the operability of the process, formability of the layer and storage stability.

SUMMARY OF THE INVENTION

Therefore, an object of the present invention is to provide a composition particularly suitable for the formation of an electrically conductive layer to be used in an EB lithographic process; the conductive layer-providing composition having a good storage stability.

Another object of the present invention is to provide a process for the formation of EB resist patterns by which the problem of the prior art conductive layers are eliminated. In the resist formation process, the conductive layer should be easily produced without using of complicated devices such as vacuum deposition or sputtering devices, have a good production and properties reproducability, and no misalignment of the resultant resist pattern.

The inventors found that these and other objects of the present invention can be attained by using a conductive layer comprising a specific, conducting or semiconducting polymer or a non-conducting precursor thereof and a photo-acid generator sensitive to an ultraviolet radiation exposure, in combination with an EB resist layer positioned in adjacent to the conductive layer.

In one aspect of the present invention, there is provided an electrically conductive layer-providing composition comprising a conducting or semiconducting polymer having a good solubility in solvents and/or a non-conducting precursor thereof and a photo-acid generator which, upon exposure to an ultraviolet radiation having a wavelength of 300 nm or less, releases a proton acid and causes a proton doping to the polymer to thereby increase an electrical conductivity of the polymer to a level sufficient to cause a discharge of an accumulated electrical charge in the electrically conductive layer and/or one or more layers adjacent thereto during an electron beam lithographic process.

In another aspect of the present invention, there is provided a process for the formation of resist pattern by an electron beam lithographic process, comprising the steps of:

forming an electrically conductive layer, from a composition comprising a conducting or semiconducting polymer having a good solubility in solvents and/or a non-conducting precursor thereof and a photo-acid generator which, upon exposure to an ultraviolet radiation having a wavelength of 300 nm or less, releases a proton acid and causes a proton doping of the polymer to thereby increase an electrical conductivity of the polymer to a level sufficient to cause a discharge of an accumulated electrical charge in the electrically conductive layer and/or one or more layers adjacent thereto in the electron beam lithographic process, in a selected layer position of an electron beam resist structure, exposing the electrically conductive layer to the ultraviolet radiation to cause an increase of the conductivity of the polymer thereof, and pattern-wise exposing an electron beam-sensitive resist layer to an electron beam, in the presence of the electrically conductive layer adjacent to the resist layer.

As described in detail hereinafter, when the solvent-soluble, conducting or semiconducting polymer and/or a non-conducting precursor thereof having a photo-acid generator combined therewith is exposed to an ultraviolet radiation having a wavelength of 300 nm or less, a proton doping of the polymer can be carried out as a result of the generation of a proton acid from the photo-acid generator. Proton doping increases the electrical conductivity of the polymer to a higher value to thereby cause an effective discharge or dissipation of the electrical charge accumulated in the resist layer during the EB exposure. Note, an appropriate electrical conductivity is given to the precursor upon baking or similar treatments thereof, and the ultraviolet radiation used is preferably a deep ultraviolet radiation having a wavelength of about 200 to 300 nm.

In addition, surprisingly, a combination of the polymer and/or precursor and the photo-acid generator is very stable for a long time, as long as it is not exposed to ultraviolet radiation, and the stored combination, after exposure to the ultraviolet radiation, can exhibit an increased conductivity comparable to that of a fresh combination just after preparation.

According to the present invention, an electrical conductive layer not suffering from an accumulation of the electrical charge in the resist layer during the EB exposure can be produced with a high reliability, and therefore, an EB resist pattern having a high accuracy and fine characters can be produced with a high reproducibility. These and other advantages of the present invention will be further described hereinafter.

DESCRIPTION OF THE PREFERRED EMBODIMENTS

Figure 1A:
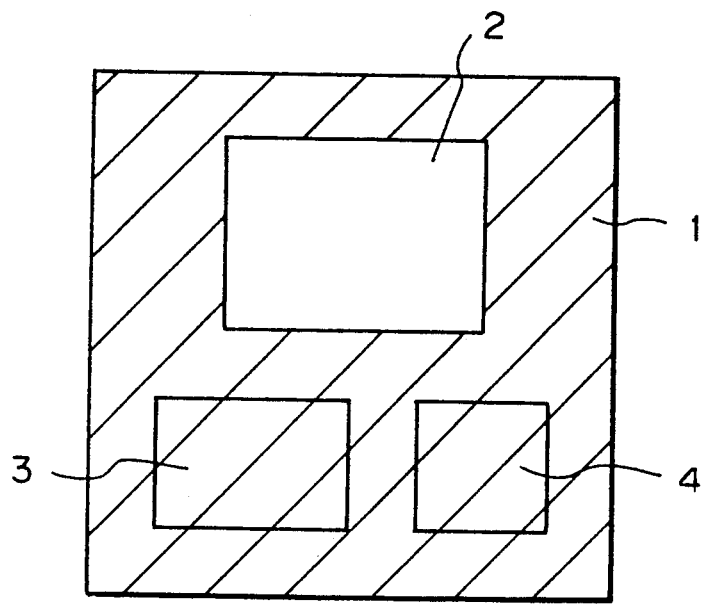
FIGS. 1A and 1B are plane views showing a misalignment of the resist pattern in a prior art EB lithographic process.
Figure 1B:
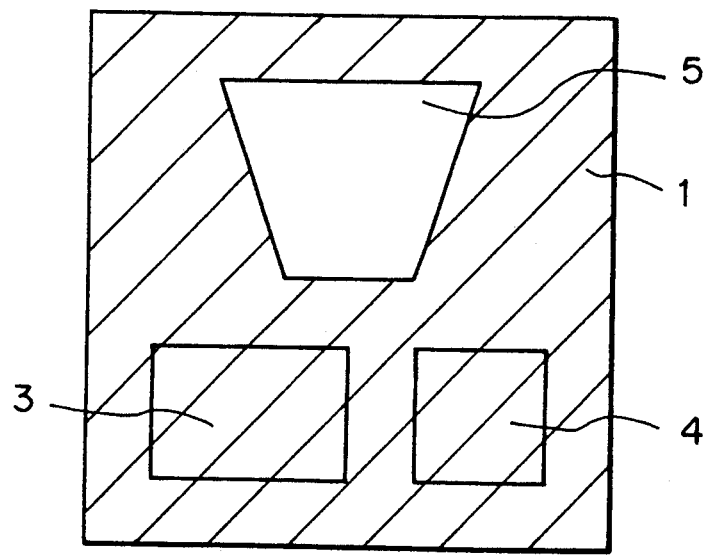

In the practice of the present invention, the conducting or semiconducting polymer used as a matrix polymer is preferably a conjugated polymer selected from the group consisting of substituted acetylene polymers, acetylene copolymers and acrylonitrile polymers. A wide variety of polymers belonging to the above group can be used, but most preferably, poly-2-acetylpyridine, a block copolymer of styrene-acetylene and polyacrylonitrile are used. Note, the term "polymer" used herein means a polymer, a copolymer including a terpolymer, and other types of polymer.

Further, the precursor of the above-described polymers used alone or in combination with the polymers is preferably of the formula:

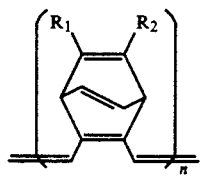

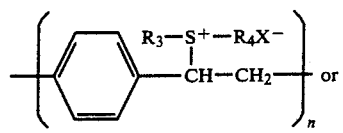

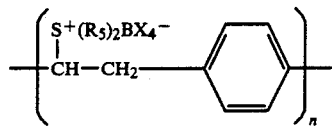

in which $R_1$ and $R_2$ may be the same or different and each represents a lower alkyl group which is unsubstituted or substituted by one or more halogen atoms, or $R_1$ and $R_2$, taken together, represent atoms necessary to complete an aromatic ring, $R_3$, $R_4$ and $R_5$ may be the same or different and each represents a lower alkyl group, X represents a halogen atom, and n denotes a polymerization degree necessary to obtain a molecular weight of less than 100,000.

Typical examples of the precursor useful in the present invention include, for example:

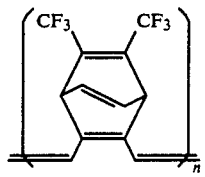

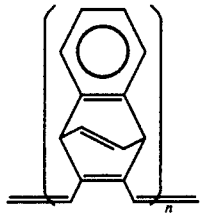

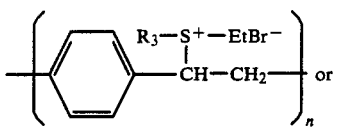

in which

Et represents an ethyl group, and n is as defined above.

In addition to these polymers and precursors, other polymers such as poly β-diketone, poly α-chloroacrylonitrile or polychloroprene having no conductivity can be advantageously used if desired. The inventors consider that these polymers are given an increased conductivity upon exposure to the ultraviolet radiation, for reasons as yet unknown.

The photo-acid generator, which is sometimes described as "PAG", used in combination with the matrix polymer to form the conductive layer-providing composition is preferably a triarylsulfonium salt of the formula:

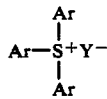

in which Ar may be the same or different and represents a substituted or unsubstituted aromatic group, and Y represents $BF_4$, $SbF_6$, $PF_6$ or $A_sF_6$, or a diaryliodonium salt of the formula:

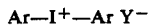

in which Ar and Y are as defined above.

The amount used of the photo-acid generator can be widely varied depending upon various factors, such as the type of generator or the desired results, and is preferably in an amount of 0.05 to 2.0 moles per liter of the composition as a coating solution.

The electrically conductive layer-providing compound can be prepared by any conventional methods, but preferably is prepared by dissolving the matrix polymer, the photo-acid generator and if necessary additives, in a selected solvent such as an organic solvent, to thereby prepare a coating solution. The thus obtained coating solution can be applied to any desired layer position of the semi-fabricated semiconductor devices, preferably by using a coating device such as a spin coater, dip coater or roller coater, although any other appropriate application means may be used. To obtain the best effects of the electrically conductive layer, the coating solution is preferably applied to a position adjacent to the EB resist layer. Note, the present invention does not exclude the insertion of an intermediate layer therebetween, in so far as such a layer does not impair the effect of the present invention.

Moreover, the electrical conductive layer can be applied to semi-fabricated devices, preferably by coating a solution of the composition on an underlying layer or circuit element, or by coating, in sequence, a solution of the matrix polymer and a solution of the photo-acid generator on the underlying layer or circuit element.

As described above paragraphs, the present invention can be advantageously applied to the EB lithographic process, and any EB resists well-known in the art can be used in the process of the present invention.

The pattern formation process of the present invention can be carried out by a single layer resist process or a multilayer resist process, such as two-layered resist process or three-layered resist process. The multi-layered resist process is useful in the formation of fine patterns on uneven substrate, because the multi-layered resist coating effectively decreases a scattering of the electron beam and an adverse influence thereof on the patterning, and/or a proximity effect. The differences between the single layer resist and two-layered resist processes in the electron beam lithographic will be described hereinafter with reference to FIGS. 2 and 3. Note, although the use of the negative-working resist is described in FIGS. 2 and 3, positive-working resists can be also used in the process of the present invention, with satisfactory results.

In a preferred embodiment of the present invention, the single layer resist process is adopted, and the electrically conductive layer is formed as an overcoating over the single EB resist layer. In this embodiment, the pattern formation process preferably comprises the steps of:

forming a layer of the electron beam resist on an underlying layer, further forming the electrically conductive layer over the electron beam resist layer, exposing the electrically conductive layer to the ultraviolet radiation, pattern-wise exposing the electron beam resist layer through the electrically conductive layer to the electron beam, and developing the exposed resist layer with a developing solution.

The above pattern formation process using the single layer resist process can be carried out, for example, as shown in FIGS. 2A to 2E.

Figure 2A:
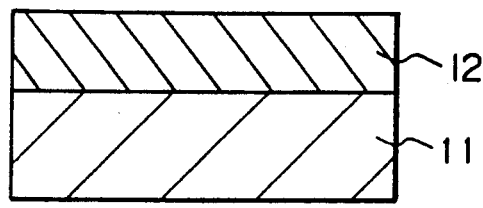
FIGS. 2A to 2E are cross-sectional views showing, in sequence, the formation of the EB resist pattern according to a preferred embodiment of the present invention.
Figure 2B:
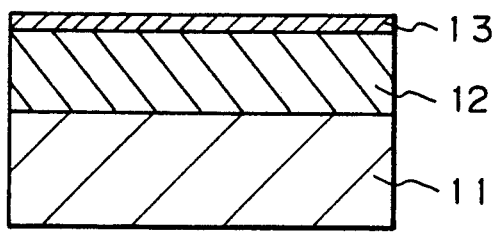
Figure 2C:
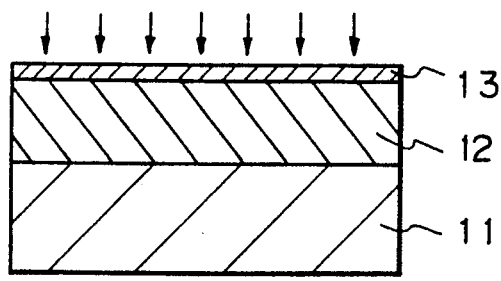
Figure 2D:
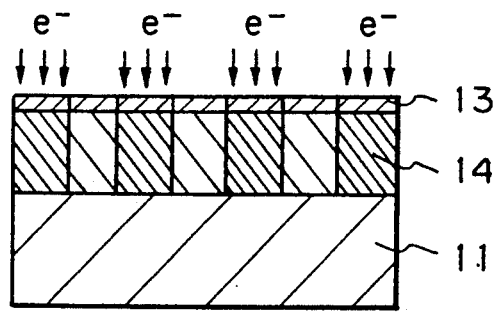
Figure 2E:
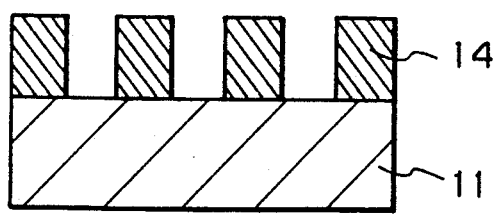

First, as shown in FIG. 2A, an EB resist layer 12 of negative-working type is formed on an substrate 11. Then, as shown in FIG. 2B, an electrically conductive layer 13 is coated over the resist layer 12. The conductive layer 13 can be formed, for example, from a solution of the conductive layer-providing composition of the present invention. After the formation of the conductive layer 13, the layer 13 is irradiated with a deep ultraviolet radiation to release a proton acid therefrom as shown by arrows in FIG. 2C. The conductivity of the layer 13 is thus increased to a level sufficient to cause a discharge of an electrical charge accumulated in the resist layer 12 during the EB exposure. Next, as shown in FIG. 2D, the resist layer 12 is irradiated, through the conductive layer 13, with a pattern of electron beams ($e^-$), and as a result of this EB patterning, an exposed area 14 of the resist layer is cross-linked and therefore becomes insoluble to a developer used in the subsequent development step. The pattern-wise exposed resist layer is then developed with the developer to remove an unexposed resist layer and an overcoated conductive layer. As shown in FIG. 2E, a fine EB resist pattern 14 not having a misaligned pattern is obtained. The resist pattern 14 is used as a mask, when the substrate 11 is etched.

In another preferred embodiment of the present invention, the two-layered resist process is adopted, and the electrically conductive layer is formed as a lower resist layer. Namely, a lower layer or leveling layer of the two-layered resist structure also can serve as the conductive layer of the present invention. In this embodiment, the pattern formation process preferably comprises the steps of:

forming the electrically conductive layer, also as a lower resist layer, exposing the electrically conductive layer to the ultraviolet radiation, further forming a layer of the electron beam resist, as an upper resist layer, over the electrically conductive layer, pattern-wise exposing the electron beam resist layer to the electron beam, developing the exposed resist layer with a developing solution, and dry etching the electrically conductive layer through the developed resist layer as a mask to thereby transfer a pattern of the resist layer to the electrically conductive layer.

The above pattern formation process using the two-layered resist process can be carried out, for example, as shown in FIGS. 3A to 3G.

Figure 3A:
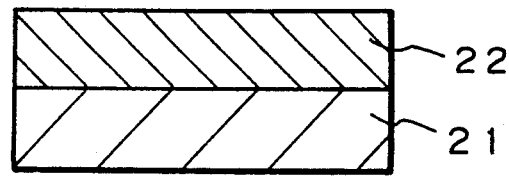
FIGS. 3A to 3G are cross-sectional views showing, in sequence, the formation of the EB resist pattern according to another preferred embodiment of the present invention.
Figure 3B:
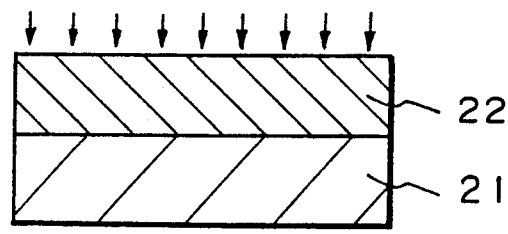
Figure 3C:
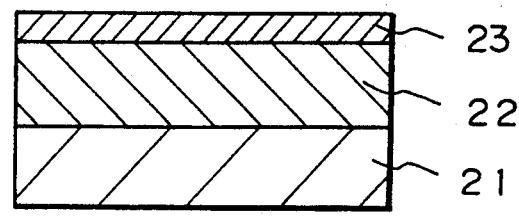
Figure 3D:
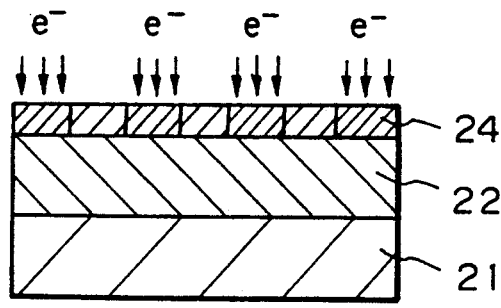
Figure 3E:
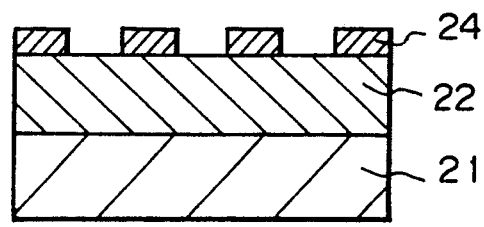
Figure 3F:
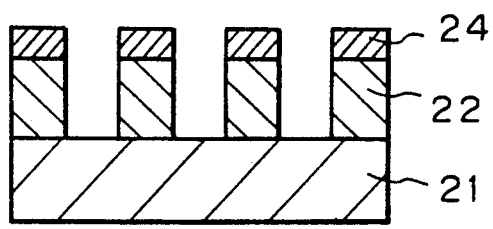
Figure 3G:
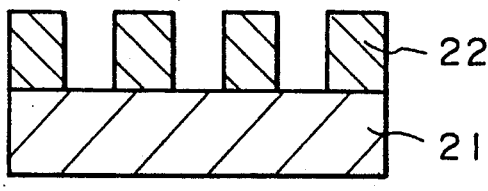

First, as shown in FIG. 3A, an lower resist layer or levelling layer 22 (also serving as an electrically conductive layer of the present invention) is formed on a substrate 21. Next, as shown in FIG. 3B, the lower resist layer 22 is irradiated with a deep ultraviolet radiation (see arrows) to release a proton acid. The function of the released proton acid was described with reference to FIG. 2C (single layer resist process). After the ultraviolet exposure, as shown in FIG. 3C, an upper resist layer or EB resist layer 23 of negative-working type is coated over the lower resist layer 22 to complete a two-layered resist structure. The EB resist layer 23 is thinner than the layer 22. Thereafter, the upper resist layer 23 is irradiated with a pattern of electron beams (e−), as shown in FIG. 3D. The electron beams are not distorted because of the presence of the underlying resist layer 22 having a high conductivity, and as shown, an exposed layer 24 of the upper resist layer is made insoluble to an developer due to a cross-linking of the EB resist. After completion of the EB patterning, the exposed upper resist layer is developed with the developer to remove only the unexposed areas thereof, as shown in FIG. 3E, and following the patterning of the upper resist layer, as shown in FIG. 3F, the pattern 24 of the upper resist layer is transferred to the underlying lower resist layer 22 by dry etching the layer 22 through the patterned resist 24 as a mask. The resulting pattern 22 of the lower resist layer is not being misaligned, as shown in FIG. 3G.

Although not shown, the pattern formation using the positive-working resists in the processes of FIGS. 2 and 3 will be easily understood to a person skilled in the art.

The present invention will be further described with reference to following working examples and comparative examples.

EXAMPLE 1

This is a comparative example.

A solution of novolak photoresist ("OFPR-800" commercially available from Tokyo Ohka Co., Ltd.) was spun-coated at a thickness of 2.0 μm on a silicon substrate or wafer, and baked at 200° C. for 20 minutes. A lower resist layer was formed, and then a solution of polymethylsilsesquioxane (PMSS) was spun-coated at a thickness of 0.2 μm on the lower resist layer, and baked at 80° C. for 20 minutes, whereby an upper resist layer was formed. To evaluate the misalignment of the EB pattern, the upper resist layer was exposed to a predetermined vernier pattern of EB at an accelerated voltage of 20 $k_eV$, and the exposed resist layer was developed by spraying methyl isobutyl ketone (MIBK) for 30 seconds, whereby an unexposed area of the resist layer was removed. Subsequent to the development, the silicon substrate was rinsed in isopropyl alcohol (IPA) for 30 seconds. Measurements of the resultant EB resist pattern indicated that a pattern misalignment of 0.4 μm had occurred.

EXAMPLE 2

This is a comparative example.

The procedure of Example 1 described above was repeated except that the novolak photoresist was replaced by polyacrylonitrile. Measurements of the resultant EB resist pattern indicated that a pattern misalignment of 0.2 μm had occurred.

EXAMPLE 3

This is a comparative example.

A solution of polymethylmethacrylate (PMMA) was spun-coated at a thickness of 2.0 μm on a silicon substrate and baked at 170° C. for 20 minutes, whereby a single resist layer was formed. To evaluate misalignment of the EB pattern, the resist layer was exposed to a predetermined vernier pattern of EB at an accelerated voltage of 20 $k_eV$, the exposed resist layer was developed by dipping the substrate in MIBK for one minute, and an unexposed area of the resist layer was removed. Subsequent to the development, the substrate was rinsed in IPA for 30 seconds. Measurements of the resultant EB resist pattern indicated that a pattern misalignment of 0.6 μm had occurred.

EXAMPLE 4

The procedure of Example 1 was repeated except that the lower resist layer was formed as follows:

1.0 mole/l of a photo-acid generator

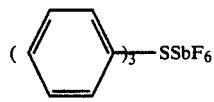

was added to a solution of polyacrylonitrile in methyl cellusolve acetate (MCA), the resultant solution was spun-coated at a thickness of 2.0 μm on a silicon substrate, and baked at 250° C. for 20 minutes in a nitrogen atmosphere, and the resultant lower resist layer was exposed to a deep ultraviolet radiation (254 nm), from a Xe-Hg (xenon-mercury vapor) lamp, for 5 minutes in an argon atmosphere. The resist layer was changed by the deep UV exposure to a layer having a high conductivity.

After formation of the lower resist layer, the formation of the upper resist layer, EB exposure, development and rinsing treatment were carried out as in Example 1. Measurements of the resultant EB resist pattern indicated that no pattern misalignment had occurred. Namely, in this example, misalignment of the pattern was prevented by using the conductive layer-providing composition of the present invention. This is in contrast with Example 1 (pattern misalignment of 0.4 μm) and Example 2 (pattern misalignment of 0.2 μm).

EXAMPLE 5

The procedure of Example 4 was repeated except that the photo-acid generator-containing solution prepared in Example 4 was stored for 6 months, before coating onto the silicon substrate. Measurements of the resultant EB resist pattern indicated that no pattern misalignment had occurred. This showed that the photo-acid generator-containing solution of the present invention, before the deep UV exposure, can be stored for a long period of time without problems.

EXAMPLE 6

The procedure of Example 1 was repeated except that the lower resist layer was formed as follows:

0.1 mole/l of a photo-acid generator:

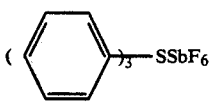

was added to a solution of poly 7,8-bis-(trifluoromethyl)tricyclo[4.2.2.0$^{2.5}$]deca-3,7,9-triene, as a precursor of the conductive polymer, in monochlorobenzene. The precursor had the chemical formula:

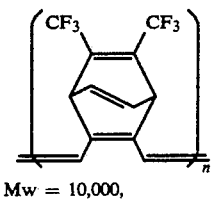

Mw = 10,000, and was prepared in accordance with the methods described in J. H. Edwards et al, Polymer, Vol. 21, p. 595 (1980) and Vol. 25, p. 395 (1984). The resultant solution was spun-coated at a thickness of 2.0 μm on a silicon substrate and baked at 200° C. for 20 minutes in a nitrogen atmosphere, and the resultant lower resist layer was exposed to a deep ultraviolet radiation (254 nm), from a Xe-Hg lamp, for 5 minutes in an argon atmosphere. The deep UV exposure caused the resist layer to be changed to a layer having a high conductivity.

After formation of the lower resist layer, the formation of the upper resist layer, EB exposure, development and rinsing treatment were carried out as in Example 1. Measurements of the resultant EB resist pattern indicated that a negligible pattern misalignment of 0.15 μm had occurred.

EXAMPLE 7

The procedure of Example 6 was repeated except that the concentration of the photo-acid generator used was increased to 0.2 mole/l. Measurements of the resultant EB resist pattern indicated that no pattern misalignment had occurred.

EXAMPLE 8

The procedure of Example 6 was repeated except that 0.1 mole/l of triarylsulfonium salt as the photo-acid generator was replaced by 1.0 mole/l of diaryliodonium salt:

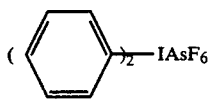

Measurements of the resultant EB resist pattern indicated that no pattern misalignment had occurred.

EXAMPLE 9

The procedure of Example 3 was repeated except that, after the formation of the resist layer and before the EB exposure, a solution of poly 7,8-bis(trifluoromethyl)tricyclo[4.2.2.0$^{2.5}$]deca-3,7,9-triene, prepared in Example 6, in monochlorobenzene, to which solution 1.0 mole/l of the photo-acid generator:

was added, was spun-coated at a thickness of 50 nm on the PMMA resist layer (2.0 μm thickness), and baked at 170° C. for 20 minutes in a nitrogen atmosphere. The overcoat layer was exposed to a deep ultraviolet radiation (254 nm), from a Xe-Hg lamp, for 5 minutes in an argon atmosphere to make it an electrically conductive layer.

Measurements of the resultant EB resist pattern indicated that no pattern misalignment had occurred.

EXAMPLE 10

The procedure of Example 9 was repeated except that the concentration of the photo-acid generator was reduced to 0.1 mole/l. Measurements of the resultant EB resist pattern indicated that no pattern misalignment had occurred.

EXAMPLE 11

This is a comparative example.

The procedure of Example 1 was repeated, except for the following:

(1) The novolak photoresist was replaced with poly β-diketone, and a coating thereof was baked at 100° C. for 20 minutes.

(2) The pattern-wise EB exposure was made at an accelerated voltage of 30 keV.

Measurement of the resultant EB resist pattern indicated that a pattern misalignment of 0.13 μm had occurred.

EXAMPLE 12

This is a comparative example.

The procedure of Example 1 was repeated, except for the following:

(1) The novolak photoresist was replaced by polychloroprene, and a coating thereof was baked at 100° C. for 20 minutes.

(2) The pattern-wise EB exposure was made at an accelerated voltage of 30 keV.

Measurements of the resultant EB resist pattern indicated that a pattern misalignment of 0.15 μm had occurred.

EXAMPLE 13

This is a comparative example.

The procedure of Example 1 was repeated, except for the following:

(1) The novolak photoresist was replaced by poly α-chloroacrylonitrile, and a coating thereof was baked at 100° C. for 20 minutes.

(2) The pattern-wise EB exposure was made at an accelerated voltage of 30 keV.

Measurements of the resultant EB resist pattern indicated that a pattern misalignment of 0.13 μm had occurred.

EXAMPLE 14

The procedure of Example 11 was repeated except that 1.0 mole/l of a photo-acid generator:

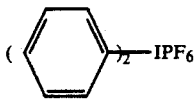

was incorporated to the coating solution of poly β-diketone.

Measurements of the resultant EB resist pattern indicated that no pattern misalignment had occurred.

EXAMPLE 15

The procedure of Example 12 was repeated except that after the baking of the polychloroprene coating, the silicon substrate was dipped in a solution of a photo-acid generator:

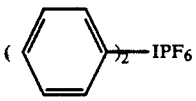

in methyl cellosolve, and baked at 100° C. for 5 minutes.

Measurements of the resultant EB resist pattern indicated that no pattern misalignment had occurred.

EXAMPLE 16

The procedure of Example 13 was repeated except that, after the baking of the poly α-chloroacrylonitrile coating, the silicon substrate was dipped in a solution of a photo-acid generator:

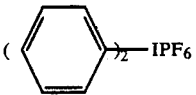

in methyl cellosolve, and baked at 100° C. for 5 minutes.

Measurements of the resultant EB resist pattern indicated that no pattern misalignment had occurred.

What is claimed is:

1. A process for the formation of resist patterns in an electron beam lithographic process, comprising the steps of:
   forming an electrically conductive layer, from a composition comprising a conducting or semiconducting polymer having a good solubility in solvents and/or a non-conducting precursor thereof and a photo-acid generator which, upon exposure to an ultraviolet radiation having a wavelength of 300 nm or less, release a proton acid and cause a proton doping to the polymer to thereby increase an electrical conductivity of the polymer to a level sufficient to cause a discharge an accumulated electrical charge in the electrically conductive layer and/or one or more layers adjacent thereto in the electron beam lithographic process, in the electron beam lithographic process, in a selected layer position of an electron beam resist structure,
   exposing the electrically conductive layer to the ultraviolet radiation to cause an increase of the conductivity of the polymer thereof, and
   pattern-wise exposing an electron beam-sensitive resist layer to an electron beam, in the presence of the electrically conductive layer adjacent to the resist layer.

2. A process according to claim 1, in which the solvent-soluble polymer is a conjugated polymer selected from the group consisting of substituted acetylene polymers, acetylene copolymers and acrylonitrile polymers.

3. A process according to claim 1, in which a precursor of the solvent-soluble polymer is of the formula:

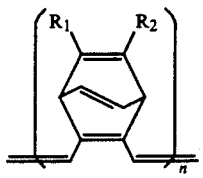

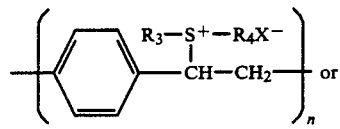

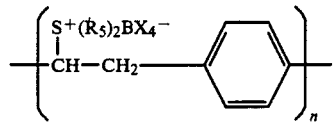

in which
   $R_1$ and $R_2$ may be the same or different and each represents a lower alkyl group which is unsubstituted or substituted by one or more halogen atoms, or
   $R_1$ and $R_2$, taken together, represent atoms necessary to complete an aromatic ring,
   $R_3$, $R_4$ and $R_5$ may be the same or different and each represents a lower alkyl group,
   X represents a halogen atom, and
   n denotes a polymerization degree necessary to obtain a molecular weight of less than 100,000.

4. A process according to claim 1, in which the photo-acid generator is a triarylsulfonium salt of the formula:

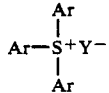

in which
   Ar may be the same or different and represents a substituted or unsubstituted aromatic group, and
   Y represents $BF_4$, $SbF_6$, $PF_6$ or $AsF_6$.

5. A process according to claim 1, in which the photo-acid generator is a diaryliodonium slat of the formula:

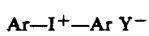

in which Ar and Y are as defined above.

6. A process according to claim 1 in which the photo-acid generator is used in an amount of 0.05 to 2.0 moles per liter.

7. A process according to claim 1, in which the electrical conductive layer is provided by coating a solution of the composition on an under layer.

8. A process according to claim 1, in which the electrical conductive layer is provided by coating a solution of the photo-acid generator on a coating of the solvent-soluble polymer and/or precursor thereof previously formed on an underlying layer.

9. A process according to claim 1, in which the electrically conductive layer is formed as an overcoat over an electron beam resist of a single layer structure.

10. A process according to claim 9, which comprises the steps of:
   forming a layer of the electron beam resist on an underlying layer,
   further forming the electrically conductive layer over the electron beam resist layer,
   exposing the electrically conductive layer to the ultraviolet radiation,
   pattern-wise exposing the electron beam resist layer through the electrically conductive layer to the electron beam, and
   developing the exposed resist layer with an developing solution.

11. A process according to claim 1, in which the electrically conductive layer is formed as a lower resist layer in an electron beam resist of a two-layered structure.

12. A process according to claim 11, which comprises the steps of:
   forming the electrically conductive layer, also as a lower resist layer, on an underlying layer,
   exposing the electrically conductive layer to the ultraviolet radiation,
   further forming a layer of the electron beam resist, as an upper resist layer, over the electrically conductive layer,
   pattern-wise exposing the electron beam resist layer to the electron beam,
   developing the exposed resist layer with a developing solution, and
   dry etching the electrically conductive layer through the developed resist layer as a mask to thereby transfer a pattern of the resist layer to the electrically conductive layer.

13. A process according to claim 1, which is used in the production of semiconductor devices.

14. A process according to claim 12, in which an underlying layer is etched through the patterned resist layer as a mask to form a part of the semiconductor devices.

* * * * *